United States Patent [19]

Nelson et al.

[11] Patent Number: 4,655,164

[45] Date of Patent: Apr. 7, 1987

[54] FIXTURE FOR SOLDER PROCESSING INTEGRATED CIRCUIT PACKAGE LEADS

[75] Inventors: Leonard Nelson, Cherry Hill; Frank N. Travia, Jr., Waterford Works, both of N.J.

[73] Assignee: RCA Corporation, Princeton, N.J.

[21] Appl. No.: 804,391

[22] Filed: Dec. 4, 1985

[51] Int. Cl.$^4$ ............................................. B05C 13/02
[52] U.S. Cl. ...................................... 118/503; 269/900
[58] Field of Search ................ 269/900, 903; 118/503, 118/505

[56] References Cited

U.S. PATENT DOCUMENTS

| | | | |
|---|---|---|---|
| 2,475,434 | 7/1949 | Moss | 118/503 X |
| 3,395,439 | 8/1968 | Palesi et al. | 269/903 X |
| 4,286,542 | 9/1981 | Belcher, Jr. et al. | 118/423 |
| 4,489,923 | 12/1984 | Barresi et al. | 269/8 |

Primary Examiner—John P. McIntosh
Attorney, Agent, or Firm—Joseph S. Tripoli; William Squire

[57] ABSTRACT

A fiberglass-reinforced epoxy base plate includes a matrix of integrated circuit package lead receiving apertures. A grooved cover locks the packages to the base plate with the leads projecting from the base plate. The projecting leads are dipped in an acid flux to remove oxidation. The leads are then tinned by passing them through a solder wave. The cover is loosened after tinning to allow the packages to resiliently move about and float. The fixture and its packages are immersed in a water bath to clean the packages. The grooves permit agitated bath water to loosen the resiliently held packages and thoroughly clean them without removing the packages from the fixture so that a single fixture is used for fluxing, tinning, and cleaning.

11 Claims, 7 Drawing Figures

FIXTURE FOR SOLDER PROCESSING INTEGRATED CIRCUIT PACKAGE LEADS

The Government has rights in this invention pursuant to Contract No. N00024-84-C-5107 awarded by the Department of the Navy.

This invention relates to chip packages for semiconductor integrated circuits and to cleaning and solder tinning the package leads.

Semiconductor integrated circuits are packaged in hermetically sealed chip carriers which have protruding electrical leads. The combination of the integrated circuit chip, the hermetic sealed carrier, and the protruding leads, is referred to as a "chip package" or "integrated circuit package." As manufactured, the leads are generally gold plated for protecting the leads from corrosion. Sometimes the leads of the packages are tin plated and are handled with the leads and the package coplanar. The pretinned leads of these packages, which, because of their general configuration, are referred to as "flat paks." The solder tin coating may interfere with subsequent lead processing which cuts and bends the leads into the final desired configuration. The extra solder tinning thickness on such leads may damage the bending and cutting dies and, therefore, undesirably interfere with the subsequent processing of the leads.

Consequently, the leads of the flat paks are required to be formed initially and then solder tinned subsequently. This sequence of events presents handling problems because the formed flat pak lead arrangement must be fluxed, solder tinned, cleaned thoroughly, and repacked in special containers for storage. The tinning step requires the use of acid flux to thoroughly clean the oxidized leads prior to tinning.

Experiments with cleaning the oxidized leads with an RMA flux (a moderately acid flux) resulted in dewetting of the subsequent solder tinning and a subsequent unacceptable solder joint. In other experiments the leads of several flat paks were immersed in an acid flux, dried, dipped into solder, and finally cleaned in water with a detergent and rinsed in a deionized water. Such leads were acceptably solder tinned. However, that particular processing employing highly acidic fluxes introduces a problem in a production environment. The acidic fluxes tend to corrode the leads if not completely removed. It is desirable to automate the above-described acceptable solder tinning process employing wave soldering apparatus. However, an automatic system still would require the acid flux to be completely removed during the package processing. Therefore, a need was found for a fixture for supporting the packages during the fluxing, soldering, and subsequent cleaning steps which would permit all of the contaminants and acid fluxes to be reliably removed. Further, a system for tinning the leads of such packages was needed for high throughput to meet a practical production goal, e.g., 1,000 units per eight-hour day. Such a goal, therefore, requires minimized manual handling of the packages in the intermediate steps between fluxing, solder tinning, and cleaning.

The present invention provides such a system in a fixture for supporting chip packages whose leads are to be solder processed while supported. The packages each comprise a body containing a chip and at least one array of leads protruding from the body. The fixture comprises a planar base member having a plurality of spaced lead receiving apertures aligned in an array. The member is sufficiently thin relative to the length of the leads such that a portion of the received leads pass therethrough and project therefrom an amount sufficient to be solder processed. The member comprises material substantially inert to acid solder flux and substantially solder repelling when contacted by molten solder. The member in a region adjacent to the aperture array supports a package body thereon.

A planar cover member includes means for releasably securing it to the base member spaced from the plane of the apertures for locking the supported packages to the base member. The cover member includes a lead processing fluid receiving groove facing the base member region and extending across the cover edge to opposite edge. The means for releasably securing include means for securing the cover member to the base member in spaced relation thereto for resiliently captivating the packages in the space between the cover and the base in one position of the cover and for fixedly locking the packages in the latter space in a second position of the cover. In the second position, the leads protruding from the fixture are dipped in acid flux. The fixture is then passed over a solder wave on an automated soldering system to pass the leads through the wave. Later, the cover is placed in the first position and the fixture is immersed in a cleaning solution bath. The solution passes through the groove in the fixture and the immersion agitation works the packages free from the base member so that the cleaning solution can flush away contaminating acid flux in regions where the cleaning fluid may not otherwise reach.

Figure 1:
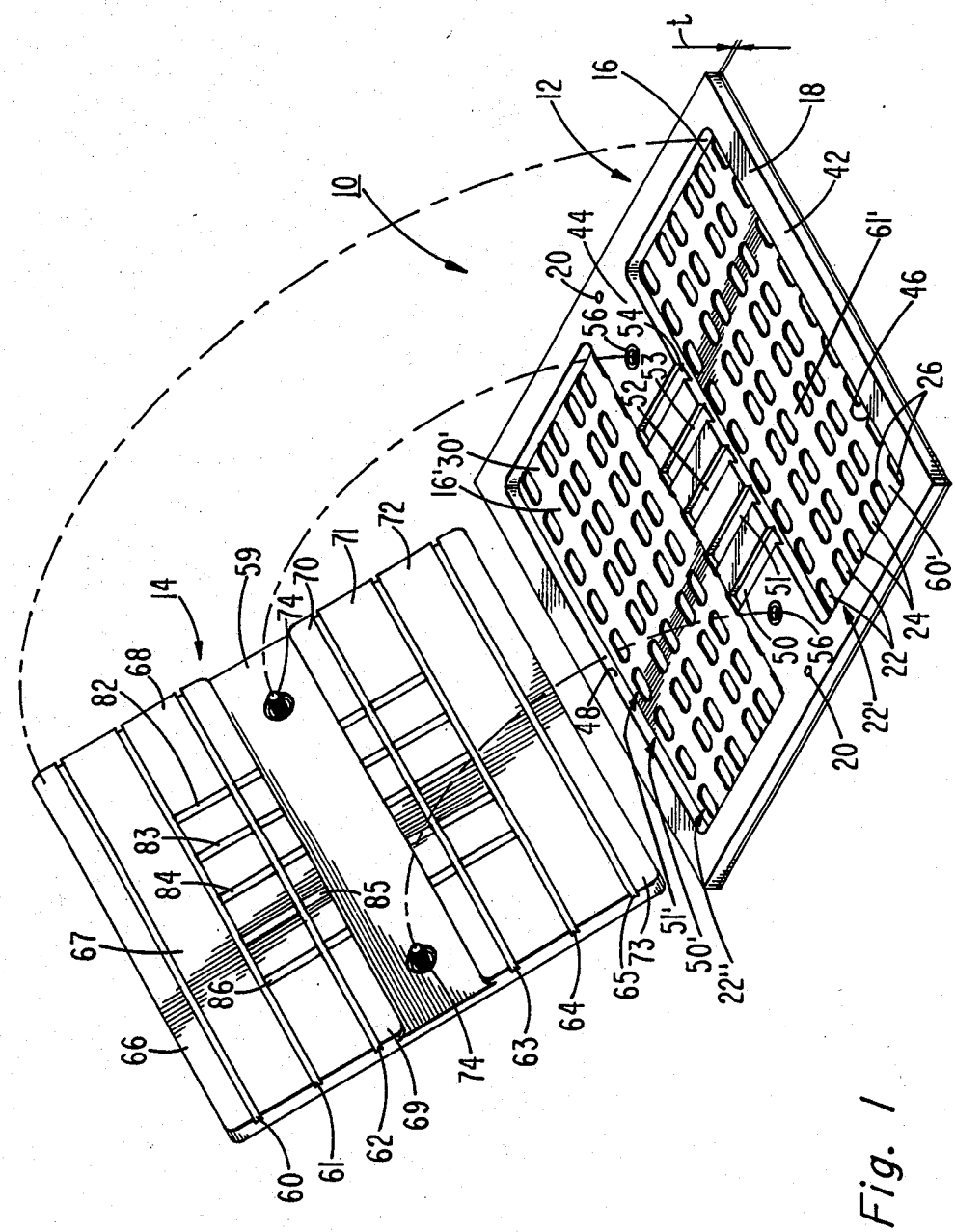
FIG. 1 is an isometric exploded view of a fixture according to one embodiment of the present invention.

In FIG. 1, fixture 10 comprises a base member 12 and a cover 14. Base member 12 comprises a base plate 16 and a reinforcing frame structure 18. Base plate 16 may be secured to the frame structure 18 by an adhesive and a pair of rivets 20. Plate 16 has an array of aperture sets 22, 24, 26, and so forth, each set comprising a pair of apertures. The apertures of the sets are aligned in columns and rows in a matrix. For example, aperture set 22 lies in a column 22' and in a row 22''. The columns and rows are perpendicular and the sets are aligned parallel. The fixture 10 has six columns 22' and nine rows 22'' of aperture sets. However, more or fewer may be employed in accordance with a given implementation.

The apertures are identical in dimension and shape. Each aperture, for example, aperture 22, is sized to receive the array of leads on one side of a chip package. The plate 16 has a thickness t which is sufficiently thin such that the leads of the chip package pass therethrough sufficiently so that the projecting lead portions are exposed for later solder processing. The term "solder processing" includes fluxing, soldering, and cleaning. The term "soldering" means any process for applying a solder coating to a substrate. In the example described herein, the soldering of the packaged leads is referred to in this art as "tinning." The purpose of the fixture 10 is to facilitate the solder tinning of the leads of chip packages.

Figure 2:
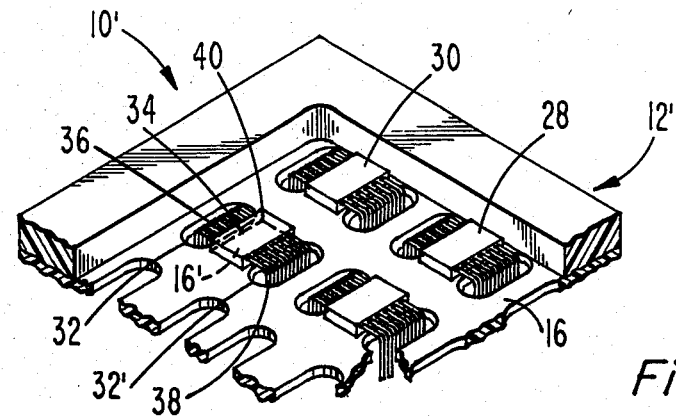
FIG. 2 is an isometric view of a portion of the base member of the fixture of FIG. 1 further including integrated circuit chip packages coupled thereto prior to assembly of the cover.
Figure 7:
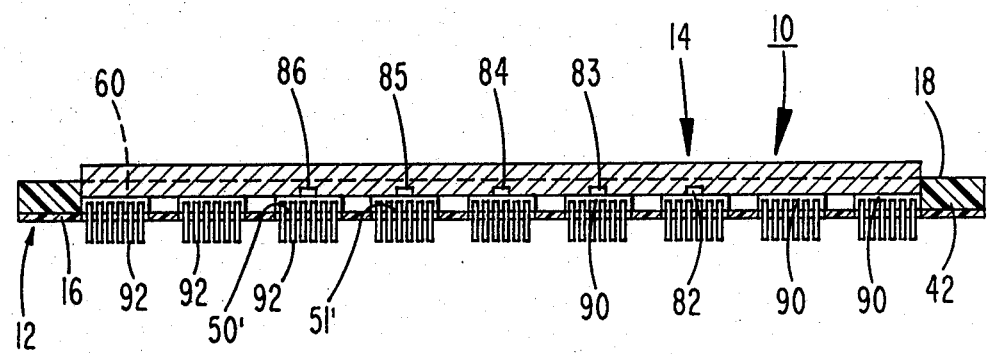
FIG. 7 is a cross-section elevation view of the embodiment of the present invention with chip packages locked in place thereto.

In FIG. 2, the bodies of chip packages 28, 30, and so forth, which are usually plastic material, rest on base plate 16. Apertures 32 and 32' comprise one aperture set. Package 34 has an array of leads 36 extending from one side and a second array 38 extending from the other opposite side. Leads 36 and 38 are bent to extend in a common direction. An entire set of leads, leads 36, for example, on one side of the package pass through one opening, aperture 32, whereas the second set of leads 38 on the other side pass through a second opening, aperture 32'. These leads have a length sufficient to pass through the apertures 32 and 32', respectively, so that the projecting portions may be exposed to subsequent soldering processes in an automated soldering line. For example, the fixture 10, FIG. 1, is intended to be employed on a conveyor system (not shown) for conveying the fixture through a system which immerses the extended portions of the leads below the base plate 16 into a solder wave (not shown). The package 34 body 40 as shown in FIG. 2 is a rectangular solid structure as known in the art. Package 34 rests on the region 16' of the base plate between apertures 32 and 32', package 30 rests on region 30' (FIG. 1), and so forth. Each package is placed with its leads orientated similarly as package 34 so that the leads of all of the packages pass through the base plate 16. When base member 12, FIG. 7, is loaded with packages, the packages lie in a matrix of columns and rows corresponding to the aperture sets to which they are coupled.

Frame structure 18, FIG. 1, comprises a rib 42, rectangular in cross-section, which extends around plate 16 adjacent to its perimeter and a central rib 44. The ribs 42 and 44 form a pair of like wells or cavities 46 and 48. Rib 44 has a set of parallel transverse centrally located grooves 50-54. Each groove 50-54 is aligned with a corresponding row of apertures. For example, groove 50 is aligned with aperture row 50', groove 51 is aligned with aperture row 51', and so forth. Thus, there are five rows of aperture sets each aligned with a different corresponding one of grooves 50-54.

A pair of threaded inserts 56 are secured to rib 44 on respective opposite sides of grooves 50-54. The base member 12 including plate 16 and frame structure 18 are made of material which is chemically inert to the acid flux employed in the soldering process and substantially reject molten solder. By way of example, plate 16 and structure 18 may be made of fiberglass-reinforced epoxy similar to printed circuit board construction. Cavities 46 and 48, by way of example, in the alternative, may be formed from a solid sheet of fiberglass-reinforced epoxy.

Figure 3:
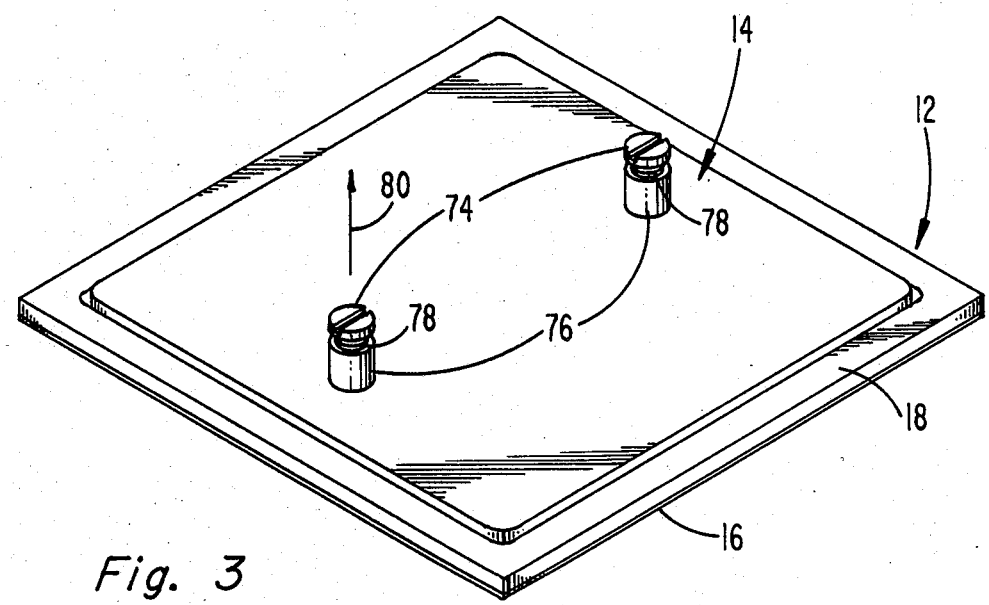
FIG. 3 is an isometric view of the fixture of FIG. 1 with the cover attached to the base member.
Figure 4:
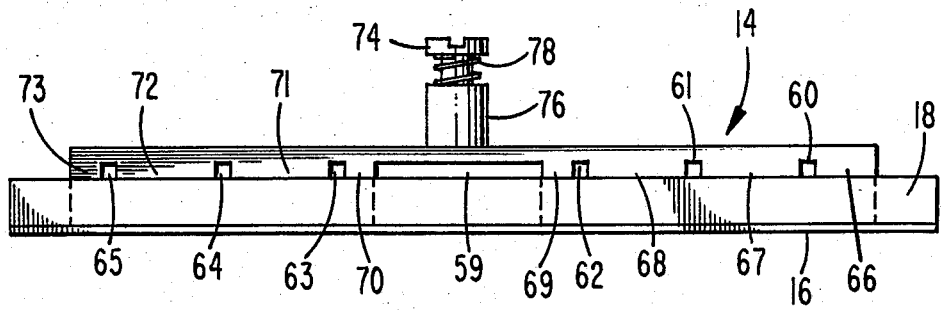
FIG. 4 is a side elevation view of the fixture of FIG. 3.

Cover 14 is solid aluminum but may be other materials. Cover 14 has a plurality of transverse parallel grooves 60-65 which are in communication with opposite cover edges. The cover has a central rectangular recess 59 which mates with rib 44. The grooves 60-65 form a plurality of pedestals 66-73. The pedestals 66-69 are received within cavity 46 and the pedestals 70-73 are received within cavity 48 of base member 12. In FIG. 3, cover 14 includes a pair of screws 74 aligned with recess 59. Each screw is captivated to a support tube 76 attached to rib 44 and includes a spring 78 for resiliently urging the screw in direction 80 away from the cover. Screws 74 mate with the threaded apertures of inserts 56, FIG. 1. When cover 14 is in place with base member 12 rib 44 is nested within the recess 59. Grooves 60-65 are parallel to the aperture columns, e.g., column 22'. Further, each of grooves 60-65, is aligned with the facing region of the base plate 16 formed by the spaces between the apertures of a column of aperture sets. For example, groove 60 is aligned on column region 60' of aperture sets 26, groove 61 is aligned on column region 61', and so forth.

In FIG. 1, cover 14 has an additional set of parallel grooves 82-86 transverse grooves 62 and 63. Grooves 82-86 are formed in each of the pedestals 68-71. Grooves 82-86 intersect grooves 62 and 63 and recess 59. The grooves 82-86 are shallower than the grooves 62 and 63 such that the grooves 62 and 63 form a continuous conduit across the cover.

Grooves 82-86 are discontinuous as they extend across the cover in a direction transverse to grooves 60-65 and are interrupted by grooves 62 and 63. When the cover 14 is assembled to the base member 12, the grooves 82-86 form a continuous conduit with the respective grooves 54-50 in the central rib 44 of the base member 12. The significance of these various grooves will be discussed shortly.

The ribs 42 and 44, FIG. 1, reinforce the base plate 16 to prevent its warping in the presence of the elevated temperatures of the soldering process. The base plate 16 is required to remain plane to insure that all of the leads extending from the base plate are immersed in the solder wave a uniform depth. Should the leads protrude in different planes such as might be caused by a warped plate 16, then some leads would not be fully exposed to the solder wave. This would be unacceptable.

Figure 5:
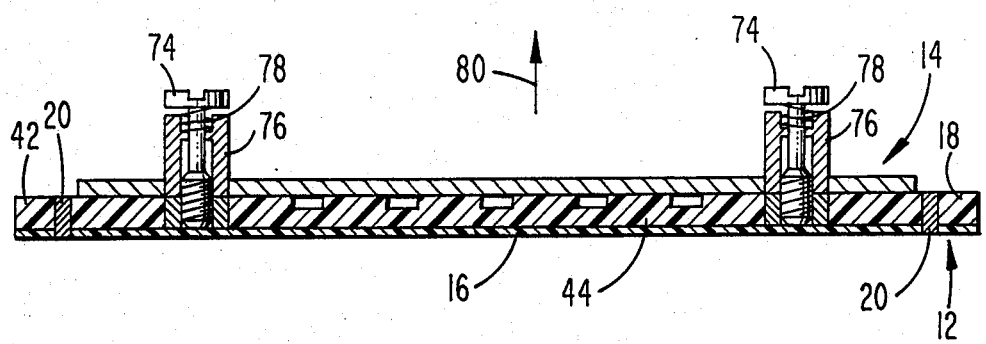
FIG. 5 is a cross-section elevation view of the embodiment of FIG. 3.
Figure 6:
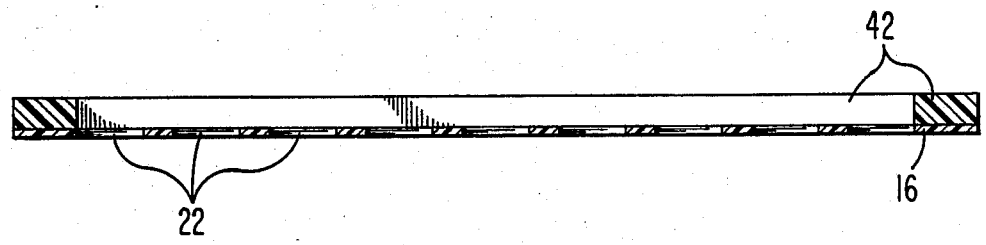
FIG. 6 is a cross-section elevation view of the base member of the embodiment of FIG. 1.

In a process for tinning the package leads, the fixture is loaded with an array of packages and the cover screwed down tightly. The screws 74, FIG. 5, are securely fastened to the base member 12 so that the cover 14 is clamped tightly against the packages 90, FIG. 7. The packages are immobile at this time in the fixture. A thin layer of RA flux approximately 0.100 inch deep is placed in a relatively flat pan (not shown). The fixture 10 is placed above the flux containing the pan and lowered slowly to dip the leads into the flux until the flux just touches the bottom surface of the fixture. The fixture is then displaced to remove the leads from the flux, placed in a holding rack (not shown), and dried for a period of about ten minutes.

The soldering machine (not shown) wave height meanwhile is adjusted until it just touches the bottom of the solder fixture as the fixture is carried on a conveyor over the wave. The fixture with the loaded packages is then placed onto the wave soldering machine conveyor. No fluxing is performed on the leads at this time. With the solder machine preheater set, for example, approximately 180° F., and a suitable conveyor speed set, e.g., 5 feet/minute, the fixture is conveyed so that the leads pass through the wave.

After the fixture and its packages are passed through the solder wave, it is then ready to be processed for cleaning the package leads. The screws on the fixture are loosened prior to cleaning so the packages are compliantly retained in the space between the cover and the base plate. That is, the cover resiliently compresses the packages against the base plate 16. When the screws are so loosened, the grooves 60-65 are exposed to the ambient atmosphere. It is important that the packages be thoroughly cleaned to remove the acid flux. Any drops of acid flux remaining on the packages would tend to cause subsequent corrosion. It is, therefore, critically important that all flux and similar contamination be removed. It is also important that the packages not be removed from the fixture to facilitate handling and to prevent package contamination.

With the cover 14 securely clamped against the packages during fluxing, the packages rest against the base plate, for example, base plate 16, FIG. 2. This configuration creates a potential hazard in that some of the acid flux (a liquid) tends to creep into the cracks and crevices in the spaces between the packages and the fixture and be trapped therein. Once so trapped, the subsequent cleaning process which requires a flushing fluid to be passed over the packages may not reach such cracks and crevices to remove the contamination. Also, such trapped flux when heated by the subsequent soldering process tends to somewhat glue the packages in place. By resiliently clamping the packages in the fixture during cleaning, the cleaning bath creates forces which tend to push the packages free of the base plate by displacing the resiliently held cover and overcome such "gluing." The springs holding the cover against the packages are sufficiently weak to allow such compliant displacement. Therefore, unless otherwise provided for by the present invention, ordinarily it would be required to manually separate the packages from the fixture to insure thorough cleaning. However, such separation is inefficient and is not required with the fixture of the present invention.

In FIG. 1, the various grooves 60-65 and 82-86 serve an important function in precluding removal of the packages from the fixture for cleaning purposes. After passing through the solder wave the fixture is submerged into a warm water bath and the rack holding the fixture is agitated for a period of time, for example, 30 seconds. This agitation includes rapid accelerations and decelerations of the fixture in the water bath and tends to cause the cleansing water to pass into the spaces formed by the grooves 60-65 and 82-86, FIG. 1. The agitated water sloshing through the fixture's grooves tends to dislodge the compliantly held packages from a fixed position against the base plate 16. This dislodging of the packages permits the flushing fluid to pass into the cracks and crevices in the space between the packages, the cover and the base member 12 to flush the acid contamination. For this reason, all of the grooves 60-65 are aligned with the base plate regions somewhat midsection of the spacing between the aperture set of each aperture column. Thus, flushing fluid enters the grooves at their exposed ends and passes through the grooves 60-65 over the bodies of the aligned packages and through the apertures 22, 24, and so forth. This sloshing action tends to create force differentials between the packages and the various air spaces adjacent to the packages as the fixture is agitated.

The agitation includes repeated immersion of the fixture 10 in and out of the water bath to expose the fixture and packages to ambient air pressure alternately with the water bath solution. This alternating passing of the fixture in and out of the ambient atmosphere into the fluid bath creates pressure differentials with various pockets of fluids in the fixture. The pressure differentials loosen all of the packages and permit the cleansing water bath to completely wash the acid flux from the packages.

The grooves 82-86 in the central region of the cover aid the release of the more centrally located packages. For this reason, only the central regions need have additional transverse grooves 82-86. An important factor is that the fixture retains the packages in a fixed plane during tinning and yet is easily adjusted to later permit the packages to resiliently displace in response to agitation in the water bath for thorough cleansing.

By employing a single fixture for holding the packages for fluxing, solder tinning, and subsequent cleaning, 350 packages may be processed in a two-hour period. This includes hand dipping the fixture into the acid flux. After cleaning in the water bath, the packages are removed from the fixture and placed into a final storage container not part of the present invention.

Thus, a single fixture has been described which can be employed for acid fluxing the leads of chip packages, solder tinning the leads in a wave soldering apparatus, and cleaning the packages without the inefficient steps of removing the packages from the fixture and transferring them to different fixtures for fluxing, soldering, and cleaning.

It is believed that the interior transverse grooves 82-86 in the cover were needed in this embodiment in order to introduce sufficient flushing of the interior located packages, for loosening those packages from the base plate 16. The number and location of the transverse grooves, therefore, is in accordance with a given implementation. The depth of the grooves can be determined empirically. The depth and cross-section area of the grooves is sufficient to allow flushing fluid to loosen the packages, as described. The screws 74 are loosened to the extent that the packages have sufficient room to move somewhat in the space between the cover and the base plate while captivating the packages thereto.

What is claimed is:

1. A fixture for supporting integrated circuit packages whose leads are to be solder processed while supported, said packages each comprising a body containing a semiconductor chip and at least one array of leads protruding from the body, said fixture comprising:

a planar base member having a plurality of spaced lead receiving apertures aligned in an array, said member being sufficiently thin relative to the length of said leads such that a portion of the received leads pass therethrough and project therefrom an amount sufficient to be solder processed, said member comprising material substantially inert to acid solder flux and substantially solder repelling when contacted by molten solder, said member in a region adjacent to said aperture array adapted for supporting a package body thereon; and a planar cover member including means for releasably securing it to the base member spaced from the plane of the apertures for locking said supported packages to said base member, said cover member including a lead processing fluid receiving groove facing said base member region and extending across said cover edge to opposite edge;

said means for releasably securing including means for securing the cover member to said base member in spaced relation thereto for resiliently captivating the packages in the space between the cover and the base in one position of said cover and for fixedly locking the packages in said latter space in a second position of said cover.

2. The fixture of claim 1 wherein said base member includes a plurality of spaced parallel, linear aperture arrays extending in a given direction, a pair of adjacent arrays adapted to receive the leads of a corresponding linear array of packages, said groove on said cover facing and extending adjacent to the region of said base between said pair of adjacent arrays in said direction.

3. The fixture of claim 2 wherein said cover member includes a plurality of said grooves in spaced, parallel relation, each groove corresponding to and aligned with a respective different base region between a separate, different pair of aligned aperture arrays.

4. The fixture of claim 3 wherein said cover member further includes at least one additional lead processing groove normal to and in communication with at least two of said plurality of grooves, said additional groove being positioned to face and be juxtaposed with the base region of at least two adjacent different pairs of apertures in a direction normal to the aperture alignment given direction.

5. The fixture of claim 4 wherein said base member includes a central rib and an annular peripheral rib upstanding from said base member to form said base member into a plurality of wells, said cover member being received in said wells, said at least one additional groove comprising a set of aligned discontinuous grooves, a portion of the set corresponding to a given well, said central rib having a groove aligned with said received aligned set of grooves to form a continuous groove with said set.

6. The apparatus of claim 5 wherein said cover member includes a plurality of said aligned sets of grooves, said central rib including a like plurality of grooves, each aligned with a different aligned groove set.

7. A fixture for supporting integrated circuit packages whose leads are to be solder processed while supported, said packages each comprising a body containing a semiconductor chip and at least one array of leads protruding from the body, said fixture comprising:

a planar base member having a matrix of lead receiving apertures, said matrix comprising a plurality of columns and rows of aperture sets, each set being arranged to receive and pass therethrough the leads of a package such that the base member supports the package body, said columns and rows forming a grid in which the aperture sets are aligned in two orthogonal directions; and a cover member including means for securing it to the base member in a first package locking position and in a second package captivating position in which the packages are free to displace between the cover and base members, said cover member including a first plurality of parallel grooves extending thereacross from edge to edge, each groove in alignment with and corresponding to a separate, different one of said columns when the cover is secured to base.

8. The fixture of claim 7 wherein said base member is fiberglass-reinforced epoxy and said cover is aluminum.

9. The fixture of claim 7 wherein said cover member includes a second plurality of parallel grooves intersecting and in communication with at least one of said first plurality of grooves.

10. The fixture of claim 9 wherein the second set of grooves have a depth smaller than the depth of the first set of grooves such that the second set of grooves intersected by the first set of grooves is discontinuous and the first set is continuous.

11. The fixture of claim 9 wherein said base member includes a peripheral and a central rib upstanding from the plane of said apertures, said central rib being parallel to one of said columns and rows, said cover including a recess for receiving said central rib, said central rib including a plurality of parallel transverse grooves aligned with and corresponding to said second set of grooves.

* * * * *